United States Patent [19]

Yamaguchi et al.

[11] Patent Number: 5,894,057
[45] Date of Patent: Apr. 13, 1999

[54] CHARGED BEAM DRAWING METHOD

[75] Inventors: Toshio Yamaguchi, Numazu; Kazuto Matsuki, Tokyo; Shuichi Tamamushi, Kawasaki; Souji Koikari, Numazu; Eiji Murakami, Kawasaki; Shigehiro Hara, Yokohama, all of Japan

[73] Assignee: Kabushiki Kaisha Toshiba, Kawasaki, Japan

[21] Appl. No.: 08/887,842

[22] Filed: Jul. 3, 1997

[30] Foreign Application Priority Data

Jul. 17, 1996 [JP] Japan ........................... 8-187472

[51] Int. Cl.$^6$ ........................... G03F 9/00; G03C 5/00
[52] U.S. Cl. ........................... 430/30; 430/296; 430/942; 250/492.2; 250/492.3
[58] Field of Search ........................... 430/30, 296, 942; 250/492.2, 492.3

[56] References Cited

FOREIGN PATENT DOCUMENTS 3-219617  9/1991  Japan.
5-234863  9/1993  Japan.

*Primary Examiner*—Christopher G. Young
*Attorney, Agent, or Firm*—Oblon, Spivak, McClelland, Maier & Neustadt, P.C.

[57] ABSTRACT

The present invention provides a charged beam drawing method comprising a first step of setting a stripe field independent of drawing pattern definition data and of determining the drawing pattern definition data which belongs to the stripe field set, a second step of setting a sub-field independent of the drawing pattern definition data and of determining the drawing pattern definition data which belongs to the sub-field, among the drawing pattern definition data determined, a third step of drawing the drawing pattern definition data which belongs to the sub-field onto an object to be subjected to drawing, a fourth step of shifting a position of the stripe field by a first predetermined value, and of shifting a position of the sub-field by a second predetermined value, and a fifth step of repeating the first to fourth steps for at least two times.

9 Claims, 5 Drawing Sheets

CHARGED BEAM DRAWING METHOD

BACKGROUND OF THE INVENTION

The present invention relates to a charged beam drawing method and a charged beam drawing apparatus for performing drawing on a mask or a wafer with use of a charged beam to manufacture a semiconductor device, and particularly, to a charged beam drawing method and a charged beam drawing apparatus which adopt a variable shape beam system in which a charged beam shaped and deflected into an arbitrary shape is irradiated on a sample.

Conventionally, to draw an arbitrary pattern on a sample such as a mask or a wafer used for manufacturing a semiconductor device, an electron beam drawing apparatus of a variable shape beam system is used in which an electron beam is shaped into a rectangular or a triangle shape of an arbitrary size, and the beam being focused and deflected is irradiated on the sample.

In this apparatus, due to limitations to the deflection amount with which an electron beam can be deflected, the fields where drawing is allowed without moving a sample are restricted. Therefore, drawing fields are divided into strips each of which has a Y-direction length equal to the maximum deflection amount and has an X-direction length equal to that of a drawing field, and drawing is performed on the entire drawing fields by combining a sequential movement of the sample in the X-direction and a stepped-movement of the sample in the Y-direction.

Further, a small sub-field is set in a maximum deflection field of a main deflector, and sub-deflection is performed at a high speed in the sub-field, thereby to achieve high-speed drawing.

Meanwhile, data which defines a pattern to be drawn is divided for every stripe in compliance with the drawing method system as described above. In addition, to compress the amount of stripe data, the stripe data is divided into small figure groups each being an aggregation of figures drawn by an equal main-deflection amount. In each of the small figure groups, positions of figures in each small figure groups are defined by coordinates relative to the origin of the small figure group.

In a conventional variable shape beam drawing apparatus, sub-fields are set so as to cover the small figure groups, and therefore, the positions of the sub-fields are controlled at random in accordance with the positions of the small figure groups.

In recent years, in accordance with down-sizing of semiconductor elements, it has been prolonged that positions and sizes of figures to be drawn are accurate and that connections at seams between figures are achieved without displacements. As a method of realizing such high accuracy, a multi-pass drawing system is adopted. This system improves the drawing accuracy by an effect of averaging attained by repeatedly drawing one same pattern.

In the multi-pass drawing system, if over-drawing is carried out under same conditions, white noise components are removed so that the drawing accuracy is increased. Further, if a drawing position in a sub-field and a drawing position in a stripe are changed, the drawing accuracy is much more increased since constant tendencies corresponding to the sub-field and the stripe are averaged. In particular, this effect is remarkable at boundaries of sub-fields and strips.

The sub-field multi-pass drawing in which sub-field boundaries are shifted in relation to a pattern figure and the stripe multi-pass drawing in which boundaries of strips are shifted in relation to a pattern figure are realized by preparing data corresponding to the number of times for which the pattern is multi-passed, while changing the data as to the manner of stripe division with respect to a pattern to be drawn and as to the manner of dividing a pattern part in a stripe, into small figure groups.

However, this kind of apparatus has a problem as follows. Specifically, in the system described above in which sub-fields are defined with respect to small figure groups constituting pattern data, there is a case that a sub-field is repeated, depending on the manner of defining the small figure groups.

This means, if pattern positions are adjacent to each other and are defined by different definitions as small figure groups, repetition of sub-field occurs. sub-fields which are regarded to be adjacent as pattern positions are defined by different definitions as small figure groups, repetition of sub-field occurs. Then, even a pattern which can originally be drawn by one sub-field is drawing by a plurality of sub-fields, resulting in a problem that the settling time of a deflector is excessively required and the drawing time is increase. This problem is not limited to a case where multi-pass drawing is carried out, but is common to a case where single drawing is carried out.

Further, to achieve sub-field multi-pass drawing and stripe multi-pass drawing in a charged beam drawing apparatus using a variable shape beam vector scanning system, as described above, different pattern data must be newly prepared for the number of times for which a pattern is multi-passed, changing the manner of stripe division and the manner of division of small figure groups with respect to a pattern to be drawn, so that burdens required for data processing and for data transmission are large. In addition, when the number of times for which a pattern is multi-passed is changed, all patterns to be multi-passed must be newly prepared.

Thus, in a conventional system in which sub-fields are defined for small figure groups constituting pattern data, there is a problem that repetition of sub-fields occurs and the settling time of a deflector is required excessively, so that the drawing time is increased. In addition, to perform sub-field multi-drawing and stripe multi-drawing, different pattern data must be newly prepared for the number of times for which a pattern is multi-passed.

The present invention has been made in view of the above situation, and has an object of providing a charged beam drawing method which realizes sub-field multi-drawing and stripe multi-drawing only with use of one piece of drawing pattern definition data, without involving large repetition of sub-fields and without preparing data in compliance with the number of times for which a pattern is multi-passed.

Further, the present invention has another object of providing a charged beam drawing apparatus which realizes sub-field multi-drawing and stripe multi-drawing only with use of one piece of drawing pattern definition data, without involving large repetition of sub-fields and without preparing data in compliance with the number of times for which a pattern is multi-passed.

BRIEF SUMMARY OF THE INVENTION

Therefore, according to the first aspect of the present invention, there is provided a charged beam drawing method comprising: a first step of setting a stripe field independent of drawing pattern definition data, and of determining the drawing pattern definition data which belongs to the stripe field set; a second step of setting a sub-field independent of the drawing pattern definition data, and of determining the drawing pattern definition data which belongs to the sub-field, among the drawing pattern definition data determined; a third step of drawing the drawing pattern definition data which belongs to the sub-field, onto an object to be subjected to drawing; a fourth step of shifting a position of the stripe field by a first predetermined value, and of shifting a position of the sub-field by a second predetermined value; and a fifth step of repeating the first to fourth steps for at least two times.

In the second aspect of the present invention according to the first aspect, the first predetermined amount is an amount obtained by dividing a height of the stripe field by a number of times for which drawing is repeatedly performed on the stripe field, and the second predetermined amount is an amount obtained by dividing a width of the sub-field by a number of times for which drawing is repeatedly performed on the sub-field.

In the third aspect of the present invention according to the first aspect, a width of a region occupied by a small figure group as a unit forming part of figure data included in the drawing pattern definition data is equal to or smaller than a between a maximum width which can be allowed by sub-deflection and a width of the sub-field, and determination obtained in the second step depends on whether or not coordinates closest to an origin of the sub-field among coordinates of small figure groups which constitute the drawing pattern definition data determined in the first belong to the sub-field.

Further, in the fourth aspect of the present invention according to the first aspect, the stripe field is a stripe-like field decided by a main-deflection width.

In the fifth aspect of the present invention according to the first aspect, the sub-field is a field smaller than a maximum field which can be allowed by sub-deflection.

According to the sixth aspect of the present invention, there is provided a charged beam drawing method comprising: a first step of setting a stripe field independent of drawing pattern definition data, and of determining the drawing pattern definition data which belongs to the stripe field set; a second step of setting a sub-field independent of the drawing pattern definition data, and of determining the drawing pattern definition data which belongs to the sub-field, among the drawing pattern definition data determined; and a third step of drawing the drawing pattern definition data which belongs to the sub-field, onto an object to be subjected to drawing.

In the seventh aspect of the present invention according to the sixth aspect, a width of a region occupied by a small figure group as a unit forming part of figure data included in the drawing pattern definition data is equal to or smaller than a difference between a maximum width which can be allowed by sub-deflection and a width of the sub-field, and determination obtained in the second step depends on whether or not coordinates closest to an origin of the sub-field among coordinates of small figure groups which constitute the drawing pattern definition data determined in the first step belong to the sub-field.

Further, in the eighth aspect of the present invention according to the sixth aspect, the stripe field is a stripe-like field decided by a main-deflection width.

Further, in the ninth aspect of the present invention according to the sixth aspect, the sub-field is a field smaller than a maximum field which can be allowed by sub-deflection.

According to the tenth aspect of the present invention, there is provided a charged beam drawing apparatus comprising: first determination means for setting a stripe field independent of drawing pattern definition data, and for determining the drawing pattern definition data which belongs to the stripe field set; second determination means for setting a sub-field independent of the drawing pattern definition data, and for determining the drawing pattern definition data which belongs to the sub-field, among the drawing pattern definition data determined; third drawing means for drawing the drawing pattern definition data determined by the second determination means, onto an object to be subjected to drawing; shift means for shifting a position of the stripe field by a first predetermined value, and for shifting a position of the sub-field by a second predetermined value; and repetition means for repeating operations of the first and second determination means, the third drawing means, and the shift means, for at least two times.

In the eleventh aspect of the present invention according to the tenth aspect, the first predetermined amount is an amount obtained by dividing a height of the stripe field by a number of times for which drawing is repeatedly performed on the stripe field, and the second predetermined amount is an amount obtained by dividing a width of the sub-field by a number of times for which drawing is repeatedly performed on the sub-field.

In the twelfth aspect of the present invention according to the tenth aspect, a width of a region occupied by a small figure group as a unit forming part of figure data included in the drawing pattern definition data is equal to or smaller than a difference between a maximum width which can be allowed by sub-deflection and a width of the sub-field, and determination obtained by the second determination means depends on whether or not coordinates closest to an origin of the sub-field among coordinates of small figure groups which constitute the drawing pattern definition data determined by the first determination means belong to the sub-field.

In the thirteenth aspect of the present invention according to the tenth aspect, the stripe field is a stripe-like field decided by a main-deflection width.

In the fourteenth aspect of the present invention according to the tenth aspect, the sub-field is a field smaller than a maximum field which can be allowed by sub-deflection.

According to fifteenth aspect of the present invention, there is provided a charged beam drawing apparatus comprising: first determination means for setting a stripe field independent of drawing pattern definition data, and for determining the drawing pattern definition data which belongs to the stripe field set;

second determination means for setting a sub-field independent of the drawing pattern definition data, and for determining the drawing pattern definition data which belongs to the sub-field, among the drawing pattern definition data determined; and third drawing means for drawing the drawing pattern definition data determined by the second determination means, onto an object to be subjected to drawing.

In the sixteenth aspect of the present invention according to the fifteenth aspect, a width of a region occupied by a small figure group as a unit forming part of figure data included in the drawing pattern definition data is equal to or smaller than a difference between a maximum width which can be allowed by sub-deflection and a width of the sub-field, and determination obtained by the second determination means depends on whether or not coordinates closest to an origin of the sub-field among coordinates of small figure groups which constitute the drawing pattern definition data determined by the first determination means belong to the sub-field.

In the seventeenth aspect of the present invention according to the fifteenth aspect, the stripe field is a stripe-like field decided by a main-deflection width.

In the eighteenth aspect of the present invention according to the fifteenth aspect, the sub-field is a field smaller than a maximum field which can be allowed by sub-deflection.

According to the nineteenth aspect of the present invention, there is provided an apparatus comprising: a memory device for storing drawing pattern definition data; a control calculator for reading the drawing pattern definition data stored in the memory device;

a pattern memory for temporarily storing the drawing pattern definition data read out from the control calculator; a pattern definition data developing unit for setting a stripe field independent of the drawing pattern definition data, for determining the drawing pattern definition data which belongs to the stripe field set, for setting a sub-field independent of the drawing pattern definition data, and for determining the drawing pattern definition data which belongs to the sub-field, among the drawing pattern definition data determined; drawing means for drawing the drawing pattern definition data determined by the drawing pattern definition data developing means, onto an object to be subjected to drawing; and shift means for shifting a position of the stripe field by a first predetermined value, and for shifting a position of the sub-field by a second predetermined value.

According to the present invention, sub-fields are set independently from drawing pattern definition data, and to which sub-fields figures belong are determined. Therefore, figures even defined as belonging to different small figure groups can be drawn together on one sub-field.

Further, the maximum size of the field which can be occupied by a small figure group as a unit constituting figure data defining a pattern is set to be equal to or less than the difference between the maximum width which can be allowed by sub-deflection and the grid cycle of the sub-field. Therefore, when performing drawing on one sub-field, a deflection amount larger than the maximum deflection amount which can be allowed by sub-deflection is not required.

Specifically, since the position of the sub-field to be set is shifted for each pass of multi-pass drawing, with respect to one piece of pattern data, one pattern figure is drawn at different positions in sub-fields, thus realizing sub-field multi-pass drawing.

Likewise, since the position of stripes to be set are shifted for each pass of multi-pass drawing, with respect to one piece of pattern data, one pattern figure is drawn at different positions in the main-deflection fields, so that stripe multi-pass drawing is realized.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE
INVENTION

In the following, an embodiment of the present invention will be explained with reference to the drawings.

Figure 1:
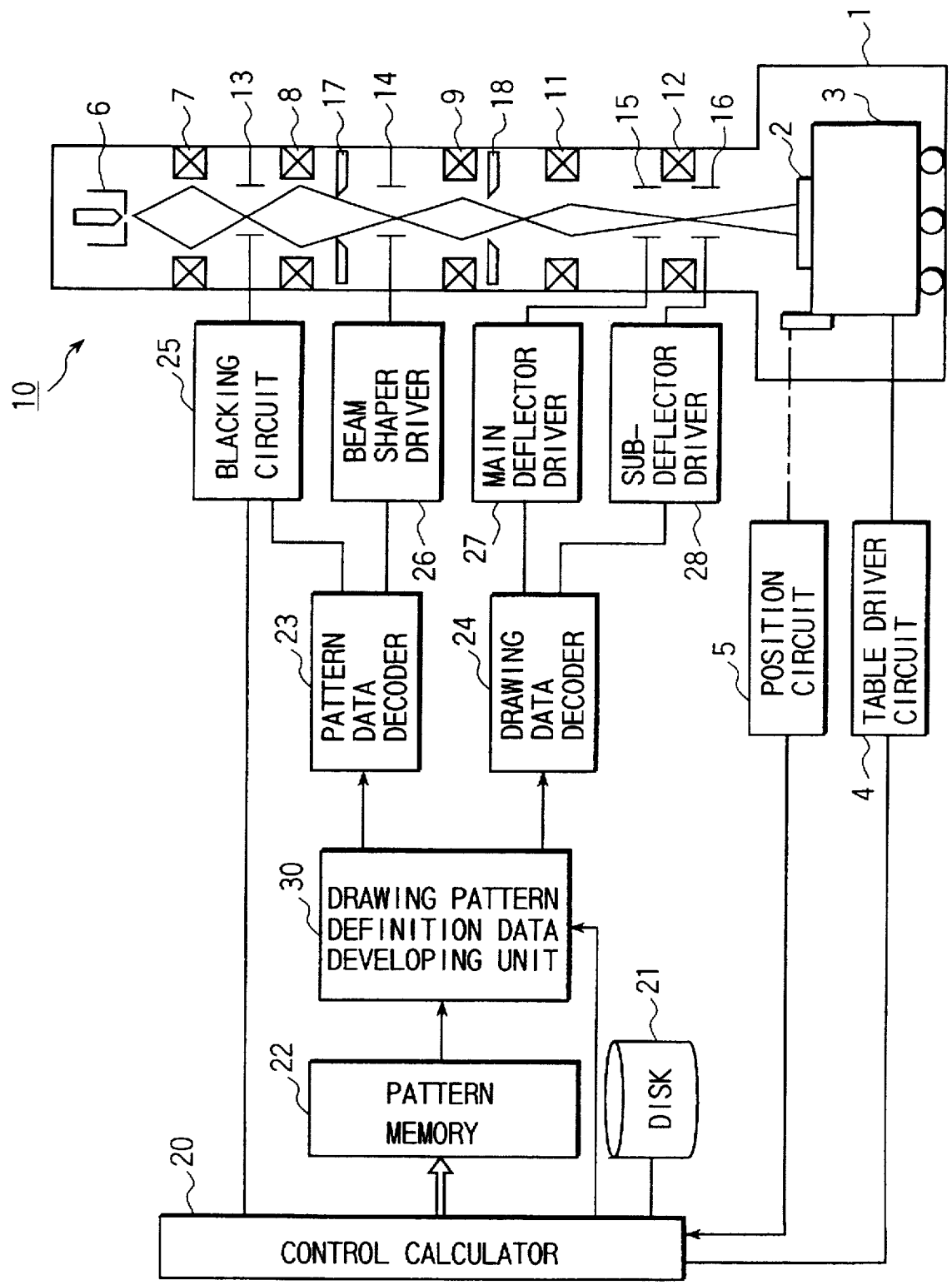
FIG. 1 is a view showing a charged beam drawing apparatus according to an embodiment of the present invention.

FIG. 1 is a view showing a charged beam drawing apparatus according to an embodiment of the present invention.

In this figure, reference numeral 1 denotes a sample chamber, and a stage 3 on which a sample 2 such as a mask substrate or the like is contained in the sample chamber 1.

The stage 3 is driven in the X-direction (or the lateral direction of the figure) and Y-directions (or the direction vertical to the surface of the figure sheet). The moving position of the stage 3 is measured by a position circuit 5 using a laser length measurement device or the like.

Above the sample chamber 1, an electron beam optical system 10 is provided. This optical system 10 comprises an electron gun 6, various lenses 7, 8, 9, 11, and 12, a blanking deflector 13, a beam size shaping deflector 14, a main deflector 15 used for beam scanning, a sub-deflector 16 used for beam scanning, and two beam shaping apertures 17 and 18.

The main deflector 15 performs positioning with respect to a predetermined sub-deflection field (or sub-field) and the sub-deflector 16 performs positioning of a figure drawing position in the sub-field, while the beam shape is controlled by the beam size shaping deflector 14 and the beam shaping apertures 17 and 18. Drawing processing is performed on a sub-field while continuously moving the stage 3 in one direction. Upon completion of drawing on one sub-field in this manner, drawing on a next sub-field is started.

Further, upon completion of drawing on a stripe field as an aggregation of a plurality of sub-fields, the stage 3 is step-moved in the direction perpendicular to the continuous moving direction in which the stage has been moved, and then, the drawing processing as described above is repeated so that drawing processing is sequentially performed on each of stripe fields.

Here, a stripe field is a stripe-like drawing field decided by a deflection width of the main deflector 15. A sub-field is a unit drawing field decided by a deflection width of the sub-deflector 16.

Meanwhile, a control calculator 20 stores drawing pattern definition data of a mask in a magnetic disc 21 as a storage medium. Drawing pattern definition data read from the magnetic disc 21 is temporarily stored in a pattern memory 22.

The drawing pattern definition data stored in the pattern memory 22 is transmitted to a drawing pattern definition data developing unit 30 by the control calculator 20.

The drawing pattern definition data developing unit 30 determines whether or not data constituting a pattern belongs to a stripe field presently being drawn and determines where and in which sub-fields small figure groups constituting a pattern are positioned.

The drawing data obtained by the pattern data developing unit 30 is analyzed by a pattern data decoder 23 as a data analysis section and a drawing data decoder 24 and is transmitted to a blanking circuit 25, a beam shaper driver 26, a main deflector driver 27, and a sub-deflector driver 28.

Specifically, the pattern decoder 23 prepares blanking data on the basis of the above data, and the blanking data is transmitted to the blanking circuit 25.

Further, desired beam size data is prepared and is transmitted to the beam shaper driver 26. Further, a predetermined deflection signal is applied to the beam size shaping deflector 14 of the electronic optical system 10 described above, thereby to control the size of the electron beam.

In addition, in the drawing data decoder 24, sub-field positioning data is prepared on the basis of the data described above, and is transmitted to the main deflector 15. From the main deflector driver 27, a predetermined deflection signal is applied to the main deflector 15 of the electronic optical system 10, thereby to deflect the electron beam so as to scan a specified sub-field position.

Further, the drawing data decoder 24 generates a control signal for sub-deflector scanning, which is transmitted to the sub-deflector driver 28. From the sub-deflector driver 28, a predetermined sub-deflection signal is applied to the sub-deflector 16, thereby to perform drawing inside a sub-field.

In the next, the drawing method according to the present embodiment will be explained.

Figure 2:
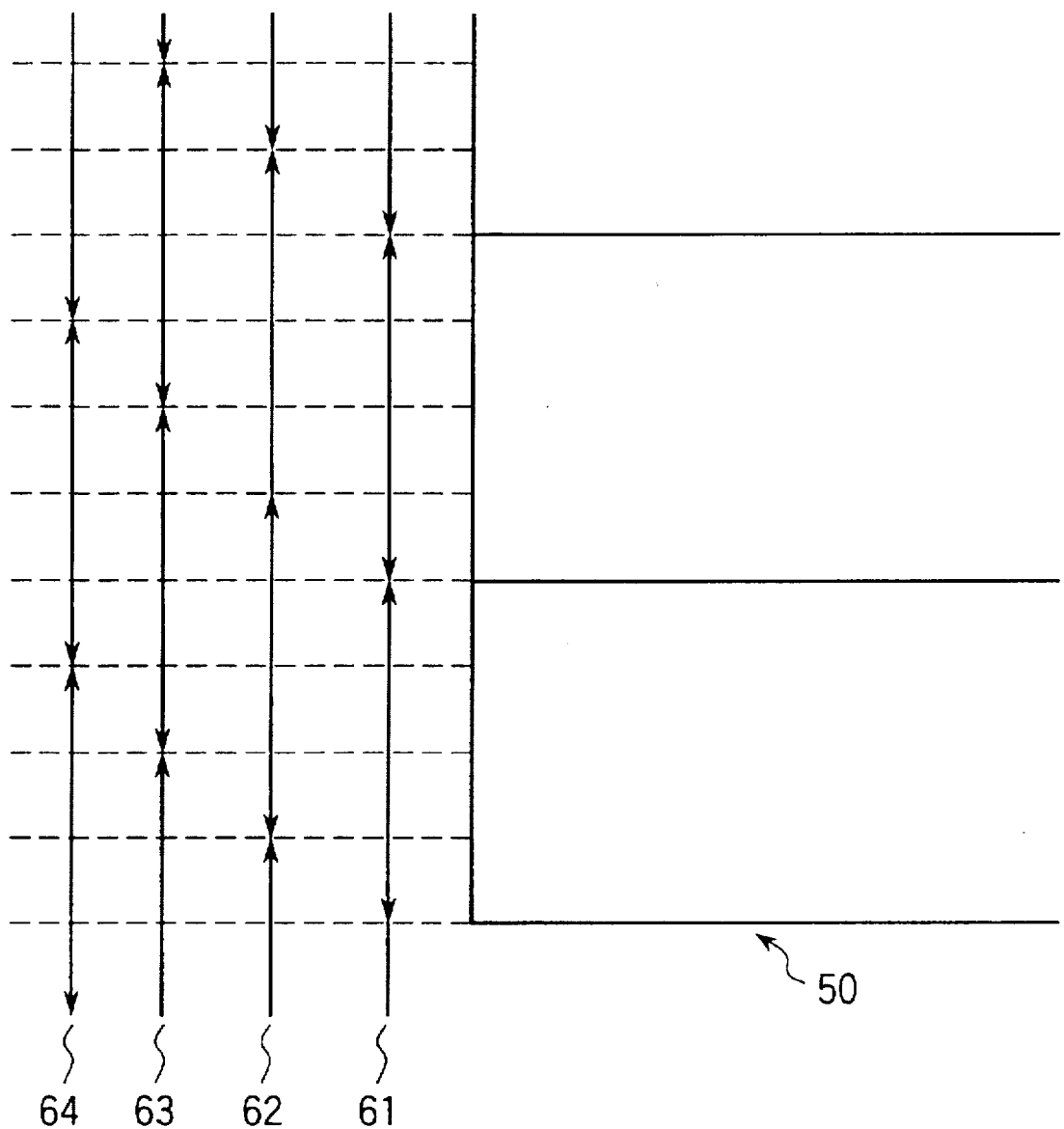
FIG. 2 is a view showing a method of setting stripe fields.

FIG. 2 is a view showing the manner of setting stripe shapes, and reference numeral 50 denotes drawing pattern definition data. The drawing pattern definition data is normally prepared and stored in form of frames having stripe shapes into which drawing pattern definition data is divided in compliance with a conventional drawing method. The frames are arranged as shown in FIG. 2.

Reference numerals 61 to 64 show setting states of strips when drawing is performed. Reference 61 indicates a drawing stripe setting state for first drawing of multi-pass drawing. References 62 indicates a drawing stripe setting state for second drawing thereof. Reference 63 denotes a drawing stripe setting state for third drawing. Reference 64 indicates a drawing stripe setting state for fourth drawing.

As shown in FIG. 2, the strips are shifted by a shift amount defined by dividing the height of the stripe-field by the number of times for which drawing is repeatedly performed.

By thus setting drawing stripe fields at positions gradually shifted on the drawing pattern definition data, one same pattern is drawn in different positions in a stripe field, drawing errors depending on positions in the stripe are averaged.

Although FIG. 2 is an example of four times multi-passing, the number of times for which drawing is repeatedly performed may be set to any times.

The pattern definition data developing unit 30 has a function of selecting and extracting what is included in the drawing stripe fields set, so that what is divided into two or more stripe fields in the data is drawn together in one stripe field.

The stripe drawing may be sequentially performed in the order from the stripe setting state 61 to the stripe setting state 62, or in the order of the lowest of the setting state 61, the second from the lowest of the setting state 62, to the second from the lowest of the setting state 63.

Figure 3:
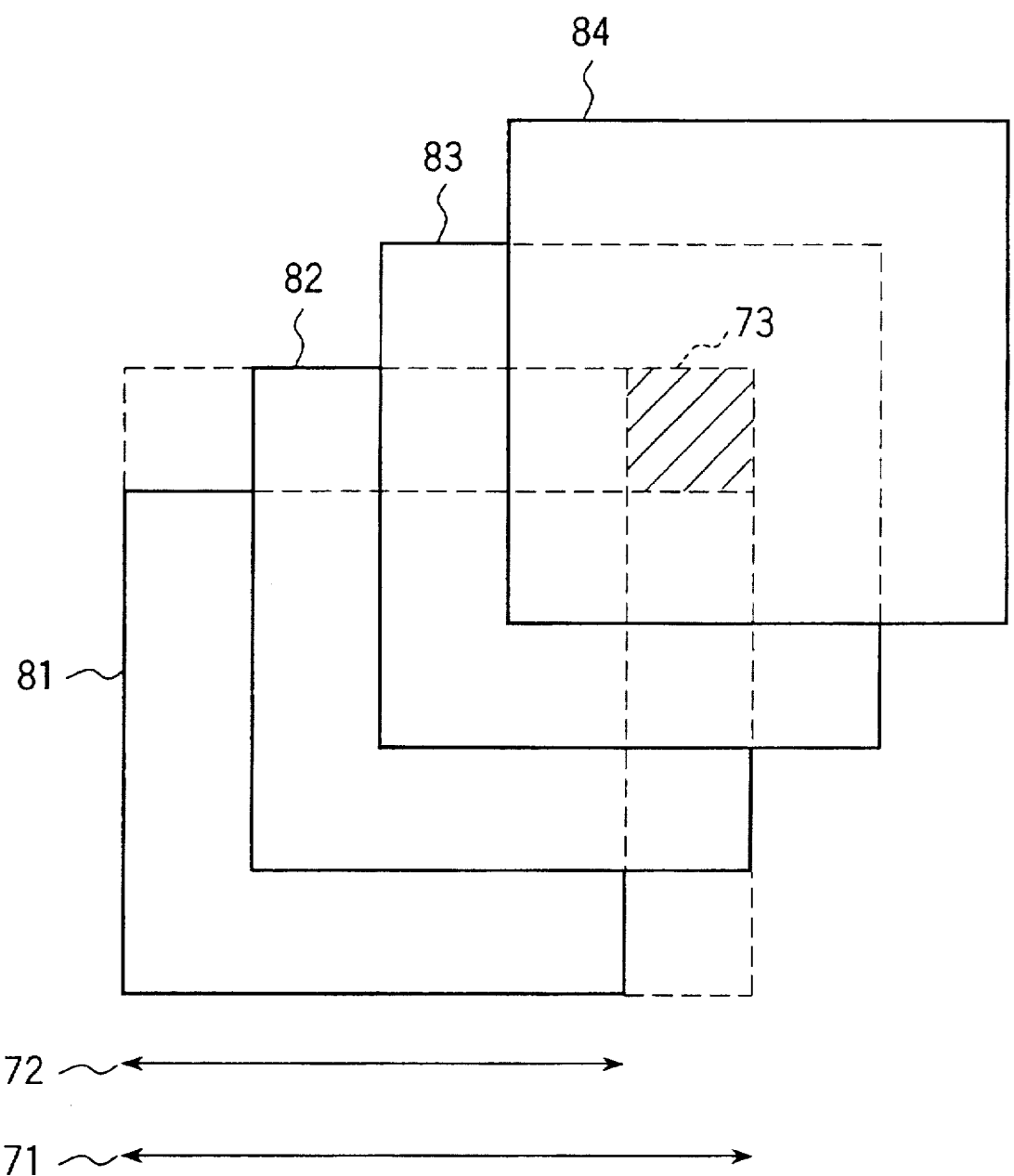
FIG. 3 is a view showing a method of setting sub-fields.

FIG. 3 is a view showing the manner of setting sub-fields and shows an example of four-times multi-passing, like in the case of FIG. 2. Reference numeral 71 indicates an arbitrary width equal to or less than the width which is allowed by the performance of a sub-deflection power source. Reference numeral 72 indicates the sub-field size when drawing is performed. Reference numerals 81 to 84 respectively indicate sub-field setting states for drawing stages of multi-passing drawing. Reference numeral 73 indicates the maximum size of a small figure group constituting the drawing pattern definition data.

The drawing pattern definition data developing unit 30 has a function of determining to which sub-field a small figure group belongs. In this determination, for example, to which sub-field coordinates of a left lower corner of a small figure group indicated by 73 belong is determined, i.e., to which sub-field coordinates closest to an origin of a sub-field among the coordinates indicating the small figure group belong is determined, to distribute small figure groups to sub-fields.

In this embodiment, the size of a small figure group is limited to the difference between the maximum width 71 which can be allowed by deflection and the sub-field width 72 set. Therefore, to perform drawing on one sub-field, a deflection amount larger than the maximum deflection amount which can be allowed by deflection is not required.

If the drawing pattern definition data is sorted with respect to lateral coordinates of FIG. 3, drawing can be performed on sub-fields having coordinates in the opposite side in the drawing proceeding direction with respect to the coordinate of data presently developed.

If the sub-fields are periodical grids which cover the entire fields, origins of grids are shifted by an arbitrary amount for each of multi-passing drawing in the two directions perpendicular to the sample plane. The shift amount is, for example, decided by dividing the drawing sub-field size (width) by the number of times for which drawing is repeatedly performed.

Figure 4:
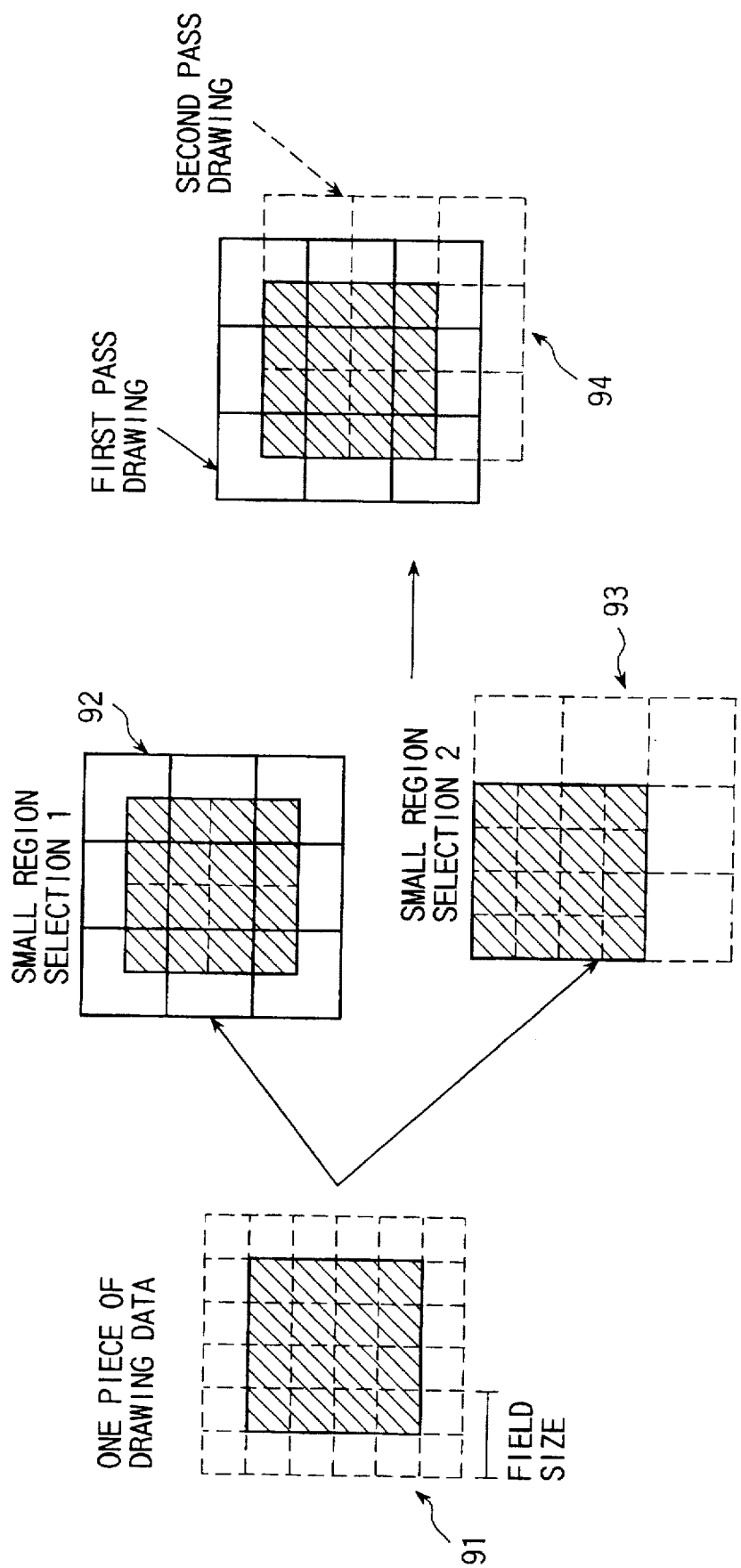
FIG. 4 is a view for explaining the principle of multi-pass drawing according to the present invention.

FIG. 4 is a view for explaining the principle of the multi-pass drawing of the present invention.

For convenience of explanation, the case of performing two-pass drawing is exemplified.

In this figure, reference numeral 91 indicates drawing pattern definition data, and this drawing pattern definition data 91 is divided into small regions (or small figures) indicated by broken lines. Here, one small figure group is constituted by 2×2 small regions.

In the first drawing, fields are set as indicated by reference numeral 92. In the second drawing, fields are set as indicated by reference numeral 93. Selected small regions are drawn, overlapped as indicated by reference numeral 94.

Figure 5:
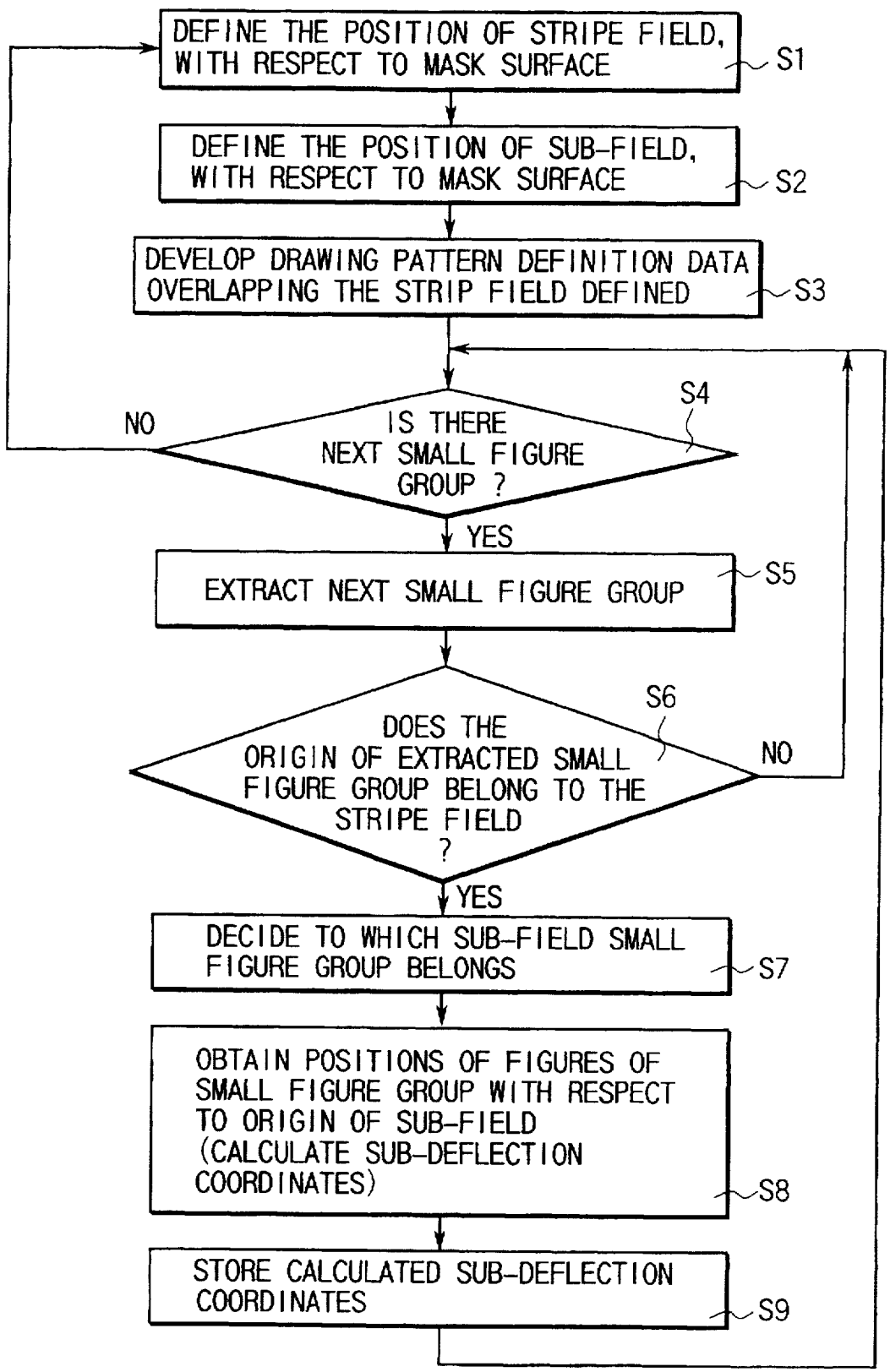
FIG. 5 is a flow-chart for explaining the operation of the electric charge beam drawing apparatus according to an embodiment of the present invention.

In the next, operation of a charged beam drawing apparatus according to embodiments of the present invention will be explained with reference to flow-charts shown in FIG. 5.

At first, position of stripe field is defined with respect to the mask surface, independently from drawing pattern definition data (in a step S1). Here, the position of stripe fields is set, shifted by a predetermined amount every time second or successive drawing is performed.

In the next, position of sub-field is defined with respect to the mask surface, independently from the drawing pattern definition data (in a step S2). Here, the position of the sub-field is shifted by a predetermined amount every time second or successive drawing is performed.

Subsequently, the drawing pattern definition data which overlaps the stripe fields defined in the step S1, i.e., the frame data which overlaps the stripe fields defined in the step S1 is developed (in a step S3).

Further, drawing pattern definition data which belongs to the sub-field defined is decided, and thereafter, the drawing pattern definition data is supplied to a pattern data decoder 23.

In the next, whether or not a next small figure group exists in the defined stripe field is determined (in a step S4). If a next small figure group does not exist in the step S4, the flow returns to the processing in the step S1.

Thus, multi-pass drawing is realized. For example, in case of two-pass drawing, the processing from the step S1 to S3 is repeatedly carried out twice.

If it is determined in the step S4 that a next small figure group exists, the small figure group is extracted (in a step S5). Subsequently, whether or not the origin of the extracted small figure group belongs to the stripe fields defined in the step S1 is determined (in a step S6).

If it is determined in the step S6 that the origin of the small figure group does not belong to the stripe field, the flow returns to the processing in the step S4.

Otherwise, if it is determined in the step S6 that the origin of the small figure group belongs to the stripe field, to which of the sub-field the small figure group belongs is determined (in a step S7).

Further, the position of the figure of the small figure group is obtained with respect to the origins of the sub-field. I.e., sub-deflection coordinates are calculated (in a step S8). Further, the calculated sub-deflection coordinates are stored into a memory or the like (in a step S9), the flow returns to the processing in the step S4.

Note that it is needless to say that the present invention is applicable to a case of single drawing, although the above embodiment has been explained with respect to a case of multi-pass drawing.

In this embodiment, the stripe field and sub-field has been explained as being set at the same time. However, only the sub-field may be shifted while the stripe field is fixed. Otherwise, the stripe field may be shifted while the sub-field is fixed.

Thus, according to this embodiment, sub-field is set independently from drawing pattern definition data, and to which sub-field figures belong are determined. Therefore, figures even defined as belonging to different small figure groups can be drawn together on one sub-field.

In addition, since positions of sub-field is shifted for each drawing stage of multi-pass drawing, one pattern figure is drawn at different positions in sub-field so that sub-field multi-pass drawing is realized.

Likewise, since positions of stripe set is shifted for each drawing stage of multi-pass drawing, one pattern figure is drawn at different positions in main-deflection field, so that stripe multi-pass drawing is realized.

Note that the present invention is not limited to the embodiment described above. The optical system structure of the drawing apparatus is not limited to the structure shown in FIG. 1, but may be variously modified in compliance with apparatus specifications.

Although the embodiment has been explained with reference to an example of an electron beam drawing apparatus, the present invention is also applicable to an ion beam drawing apparatus. Further, the present invention can be practiced in other modification forms than above, without deriving from the subject matter of the invention.

As has been explained above, according to the present invention, drawing pattern definition data of an efficient figure expression format can be directly used to perform drawing without repetition of sub-fields.

In addition, for one piece of drawing pattern definition data, multi-pass drawing can be performed for an arbitrary number of passes, without preparing drawing pattern definition data for each drawing pass of multi-pass drawing, by a calculator, or transmitting the data to a data developing circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A charged beam drawing method comprising:
    a first step of setting a stripe field independent of drawing pattern definition data, and of determining the drawing pattern definition data which belongs to the stripe field set;
    a second step of setting a sub-field independent of the drawing pattern definition data, and of determining the drawing pattern definition data which belongs to the sub-field, among the drawing pattern definition data determined;
    a third step of drawing the drawing pattern definition data which belongs to the sub-field, onto an object to be subjected to drawing;
    a fourth step of shifting a position of the stripe field by a first predetermined value, and of shifting a position of the sub-field by a second predetermined value; and
    a fifth step of repeating the first to fourth steps for at least two times.

2. A charged beam drawing method according to claim 1, wherein the first predetermined amount is an amount obtained by dividing a height of the stripe field by a number of times for which drawing is repeatedly performed on the stripe field, and the second predetermined amount is an amount obtained by dividing a width of the sub-field by a number of times for which drawing is repeatedly performed on the subfield.

3. A charged beam drawing method according to claim 1, wherein:
    a width of a region occupied by a small figure group as a unit forming part of figure data included in the drawing pattern definition data is equal to or smaller than a difference between a maximum width which can be allowed by sub-deflection and a width of the sub-field; and
    determination obtained in the second step depends on whether or not coordinates closest to an origin of the sub-field among coordinates of small figure groups which constitute the drawing pattern definition data determined in the first belong to the sub-field.

4. A charged beam drawing method according to claim 1, wherein the stripe field is a stripe-like field decided by a main-deflection width.

5. A charged beam drawing method according to claim 1, wherein the sub-field is a field smaller than a maximum field which can be allowed by sub-deflection.

6. A charged beam drawing method comprising:

a first step of setting a stripe field independent of drawing pattern definition data, and of determining the drawing pattern definition data which belongs to the stripe field set;

a second step of setting a sub-field independent of the drawing pattern definition data, and of determining the drawing pattern definition data which belongs to the sub-field, among the drawing pattern definition data determined; and a third step of drawing the drawing pattern definition data which belongs to the sub-field, onto an object to be subjected to drawing.

7. A charged beam drawing method according to claim 6, wherein:

a width of a region occupied by a small figure group as a unit forming part of figure data included in the drawing pattern definition data is equal to or smaller than a difference between a maximum width which can be allowed by sub-deflection and a width of the sub-field; and determination obtained in the second step depends on whether or not coordinates closest to an origin of the sub-field among coordinates of small figure groups which constitute the drawing pattern definition data determined in the first step belong to the sub-field.

8. A charged beam drawing method according to claim 6, wherein the stripe field is a stripe-like field decided by a main-deflection width.

9. A charged beam drawing method according to claim 6, wherein the sub-field is a field smaller than a maximum field which can be allowed by sub-deflection.

* * * * *